US010203607B2

(12) United States Patent
Schwertner et al.

(10) Patent No.: US 10,203,607 B2
(45) Date of Patent: Feb. 12, 2019

(54) OPTICAL ELEMENT UNIT FOR EXPOSURE PROCESSES

(71) Applicant: Carl Zeiss SMT GmbH, Oberkochen (DE)

(72) Inventors: Tilman Schwertner, Aalen (DE); Ulrich Bingel, Michelfeld (DE); Guido Limbach, Aalen (DE); Julian Kaller, Koenigsbronn (DE); Hans-Juergen Scherle, Aalen (DE); Jens Kugler, Aalen (DE); Dirk Schaffer, Jena (DE); Bernhard Gellrich, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1105 days.

(21) Appl. No.: 14/560,756

(22) Filed: Dec. 4, 2014

(65) Prior Publication Data

US 2015/0168846 A1    Jun. 18, 2015

Related U.S. Application Data

(63) Continuation of application No. 12/046,186, filed on Mar. 11, 2008, now Pat. No. 9,046,795, which is a continuation of application No. PCT/EP2006/065892, filed on Aug. 31, 2006.

(Continued)

(51) Int. Cl.
*G03F 7/20* (2006.01)
*G02B 27/00* (2006.01)

(52) U.S. Cl.
CPC ....... *G03F 7/7015* (2013.01); *G02B 27/0006* (2013.01); *G03F 7/70808* (2013.01);
(Continued)

(58) Field of Classification Search
CPC ............... G02B 27/0006; G03F 7/7015; G03F 7/70808; G03F 7/70816; G03F 7/70825;
(Continued)

(56) References Cited

U.S. PATENT DOCUMENTS 6,686,989 B2    2/2004   Hagiwara et al.
6,731,371 B1    5/2004   Shiraishi
(Continued)

FOREIGN PATENT DOCUMENTS

EP          1 339 099      8/2003
WO     WO 2002/084406 A   10/2002

OTHER PUBLICATIONS

International Search Report and a Written Opinion from the counterpart PCT Application No. PCT/EP2006/065892, dated Mar. 3, 2007.

*Primary Examiner* — Colin Kreutzer
(74) *Attorney, Agent, or Firm* — Fish & Richardson P.C.

(57) ABSTRACT

An optical element unit including a first optical element module and a sealing arrangement is disclosed. The first optical element module occupies a first module space and includes a first module component of a first component type and an associated second module component of a second component type. The first component type is optical elements and the second component type being different from the first component type. The sealing arrangement separates the first module space into a first space and a second space and substantially prevents, at least in a first direction, the intrusion of substances from one of the first space and the second space into the other one of the first space and the second space. The first module component at least partially contacts the first space and, at least in its area optically used, not contacting the second space. The second module component at least partially contacts the second space.

29 Claims, 8 Drawing Sheets

Related U.S. Application Data

(60) Provisional application No. 60/716,616, filed on Sep. 13, 2005.

(52) U.S. Cl.
CPC ...... *G03F 7/70825* (2013.01); *G03F 7/70883* (2013.01); *G03F 7/70908* (2013.01); *G03F 7/70916* (2013.01); *G03F 7/70933* (2013.01); *Y10T 29/49* (2015.01)

(58) Field of Classification Search
CPC ............. G03F 7/70841; G03F 7/70883; G03F 7/70908; G03F 7/70916; G03F 7/70933
USPC .............................. 355/30, 67; 359/509, 819
See application file for complete search history.

(56) References Cited

U.S. PATENT DOCUMENTS

| | | | |
|---|---|---|---|
| 9,046,795 B2 | 6/2015 | Schwertner et al. | |
| 2002/0167740 A1* | 11/2002 | Osterried | ................. G02B 7/02 359/819 |
| 2003/0020888 A1* | 1/2003 | Tanaka | ................. G03F 7/70058 355/30 |
| 2003/0151728 A1 | 8/2003 | Hishi | |
| 2003/0197844 A1 | 10/2003 | Mertens | |
| 2003/0206280 A1 | 11/2003 | Murayama | |
| 2005/0117136 A1 | 6/2005 | Tominaga | |
| 2008/0225247 A1 | 9/2008 | Schwertner et al. | |
| 2008/0285161 A1* | 11/2008 | Geuppert | ............. F16F 15/023 359/819 |

\* cited by examiner

OPTICAL ELEMENT UNIT FOR EXPOSURE PROCESSES

CROSS-REFERENCE TO RELATED APPLICATIONS

This application is a continuation of, and claims priority under 35 U.S.C. 120 to, U.S. application Ser. No. 12/046,186, filed Mar. 11, 2008, which is a continuation of, and claims priority under 35 U.S.C. 120 to, international application PCT/EP2006/065892, filed Aug. 31, 2006, which claims benefit under 35 U.S.C. 119(e)(1) of provisional U.S. Patent Application Ser. No. 60/716,616 filed Sep. 13, 2005, the entire contents of each of which are hereby incorporated herein by reference.

FIELD

The disclosure relates to optical element units for exposure processes and, in particular, to optical element units of microlithography systems. The disclosure also relates to optical exposure apparatuses including such an optical element unit. Furthermore, the disclosure relates to a method of sealing a first space of an optical element unit versus a second space of the optical element unit. The disclosure may be used in the context of photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices include a plurality of optical elements, such as lenses and mirrors etc., in the light path of the optical system. Those optical elements usually cooperate in an exposure process to transfer an image formed on a mask, reticle or the like onto a substrate such as a wafer. The optical elements are usually combined in one or more functionally distinct optical element groups. These distinct optical element groups may be held by distinct optical element units.

Optical element groups including at least mainly refractive optical elements, such as lenses, mostly have a straight common axis of symmetry of the optical elements usually referred to as the optical axis. Moreover, the optical element units holding such optical element groups often have an elongated substantially tubular design due to which they are typically referred to as lens barrels.

SUMMARY

In some embodiments, the disclosure can, at least to some extent, provide good and long-term stable and reliable imaging properties of an optical system, in particular of an optical system used in an exposure process.

In certain embodiments, the disclosure can easily and reliably prevent intrusion of contaminants into an inner part of an optical element unit in order to maximize the useful life without maintenance of the optical system within an optical element unit, in particular an optical element unit used in an exposure process.

In some embodiments, the disclosure can separate first and second spaces within an optical element unit in a simple and deformation minimized manner in order to provide good and reliable imaging properties of the optical system, in particular of an optical system used in an exposure process.

In part, the disclosure is based on the teaching that good and long term reliable imaging properties may be achieved if, on the one hand, first and second mutually separated spaces are defined within an optical element unit such that different purging flows may be established in the region of the optical elements and in the region of other components of the optical element unit, and if, on the other hand, with sealing configurations including an optical element as one of the components of the sealing configuration, the sealing elements used in the sealing configuration minimize the forces that may be introduced into the optical element via these sealing elements.

The provision of first and second mutually separated spaces allowing the establishment of different purging flows, e.g. a first purging flow in the region of an optical element and a second purging flow in the region of other components of the optical element unit, has the advantage that, in particular, in the region of such components prone to produce contaminants a second purging flow of considerable flow rate may be established without affecting the imaging quality since the first purging flow in the region of an optical element may be kept at moderate flow rates not or at least less affecting the imaging quality. The minimization of the forces, e.g. thermally induced forces, that may be introduced into the optical element via the sealing elements also provides for good and stable imaging quality since it helps minimizing the deformations that are introduced into the optical element.

Thus, according to a first aspect of the disclosure there is provided an optical element unit including at least a first optical element module and a sealing arrangement: The first optical element module occupies a first module space and includes a first module component of a first component type and an associated second module component of a second component type, the first component type being optical elements exclusively and the second component type being different from the first component type. The sealing arrangement separates the first module space into a first space and a second space and substantially prevents, at least in a first direction, the intrusion of substances or material transport from one of the first space and the second space into the other one of the first space and the second space. The first module component at least partially contacts the first space and, at least in its area optically used, does not contact the second space. The second module component at least partially contacts the second space.

According to a second aspect of the disclosure there is provided an optical exposure apparatus for transferring an image of a pattern formed on a mask onto a substrate including a light path, a mask location located within the light path and receiving the mask, a substrate location located at an end of the light path and receiving the substrate, an optical element unit according to the first aspect of the disclosure located within the light path between the mask location and the substrate location.

According to a third aspect of the disclosure there is provided an optical element unit including a first component, a second component and a sealing device. The first component is located adjacent to the second component such that a sealing gap is formed between the first component and the second component, a first space being formed at a first side of the sealing gap and a second space being formed at a second side of the sealing gap. The sealing device substantially prevents fluid exchange between the first space and the second space via the sealing gap. Furthermore, the sealing device adapted to substantially prevent, at least in a first direction, the introduction of forces into the first component via the sealing device.

According to a fourth aspect of the disclosure there is provided an optical exposure apparatus for transferring an image of a pattern formed on a mask onto a substrate including a light path, a mask location located within the light path and receiving the mask, a substrate location located at an end of the light path and receiving the substrate, an optical element unit according to the third aspect of the disclosure located within the light path between the mask location and the and the substrate location.

According to a fifth aspect of the disclosure there is provided a method of sealing a first space of an optical element unit versus a second space of the optical element unit. The method includes, in a first step, providing the optical element unit, the optical element unit including at least a first optical element module. The first optical element module occupies a first module space and includes a first module component of a first component type and an associated second module component of a second component type, the first component type being optical elements exclusively and the second component type being different from the first component type. The method further includes, in a second step, separating the first module space into a first space and a second space such that, at least in a first direction, the intrusion of substances from one of the first space and the second space into the other one of the first space and the second space is substantially prevented. In the second step, the first module space is separated such that the first module component at least partially contacts the first space and, at least in its area optically used, does not contact the second space, and such that the second module component at least partially contacts the second space.

According to a sixth aspect of the disclosure there is provided a method of sealing a first space of an optical element unit versus a second space of the optical element unit. The method includes, in a first step, providing the optical element unit including a first component, a second component and a sealing device. The first component is located adjacent to the second component such that a sealing gap is formed between the first component and the second component, the first space being formed at a first side of the sealing gap and the second space being formed at a second side of the sealing gap. The method further includes, in a second step, using the sealing device to substantially prevent fluid exchange between the first space and the second space via the sealing gap while substantially preventing, at least in a first direction, the introduction of forces into the first component via the sealing device.

According to a seventh aspect of the disclosure there is provided a method of transferring an image of a pattern onto a substrate. The method includes, in a transferring step, transferring the image of the pattern onto the substrate using an optical element unit, in the transferring step, a first space of the optical element unit is sealed versus a second space of the optical element unit using a method according to the fifth or sixth aspect of the disclosure.

According to an eighth aspect of the disclosure there is provided an optical element unit for use in a exposure process using exposure light including at least a first optical element module and a sealing arrangement. The first optical element module occupies a first module space. The sealing arrangement separates the first module space into a first space and a second space and substantially prevents, at least in a first direction, the intrusion of substances from one of the first space and the second space into the other one of the first space and the second space. The first space receives the exposure light while the second space is substantially free of the exposure light.

The above aspects of the disclosure can be used in the context of microlithography applications. However, it will be appreciated that the disclosure may also be used in any other type of optical exposure process.

Further embodiments of the disclosure will become apparent from the dependent claims and the following description of embodiments which refers to the appended figures. All combinations of the features disclosed, whether explicitly recited in the claims or not, are within the scope of the disclosure.

In some embodiments, an optical element unit includes a first part, a second part, and a viscous fluid. The first part is adjacent to the second part so that a slot is between the first part and the second part. A first space is at a first side of the slot, and a second space being is at a second side of the slot. The slot is between a recessed section defining a recess and a protrusion extending into the recess. The slot defines a passageway between the first space and the second space. The viscous fluid at least partially obstructs the passageway. The first part is selected from the group consisting of a first component and a first element mechanically connected to the first component. The second part is selected from the group consisting of a second component and a second element mechanically connected to the second component. The obstruction is adapted to substantially prevent, in a first direction and/or a second direction running transverse to the first direction, the introduction of forces of an inadmissible force level into the first component via the obstruction. The inadmissible force level is a function of an intended field of use of the first component. The field of use defines a maximum admissible deformation of the first component. The inadmissible force level is a function of the maximum admissible deformation.

In some embodiments, an optical element unit includes a first part, a second part, and a viscous fluid. The first part is adjacent to the second part so that a slot is between the first part and the second part. A first space is at a first side of the slot, and a second space being is at a second side of the slot. The slot is between a recessed section defining a recess and a protrusion extending into the recess. The slot defines a passageway between the first space and the second space. The viscous fluid at least partially obstructs the passageway. The viscous fluid has a viscosity that is adjustable via an external field. The external field includes at least one field selected from the group consisting of a magnetic field, an electric field, a thermal field and a gravitational field.

DETAILED DESCRIPTION

Figure 1:
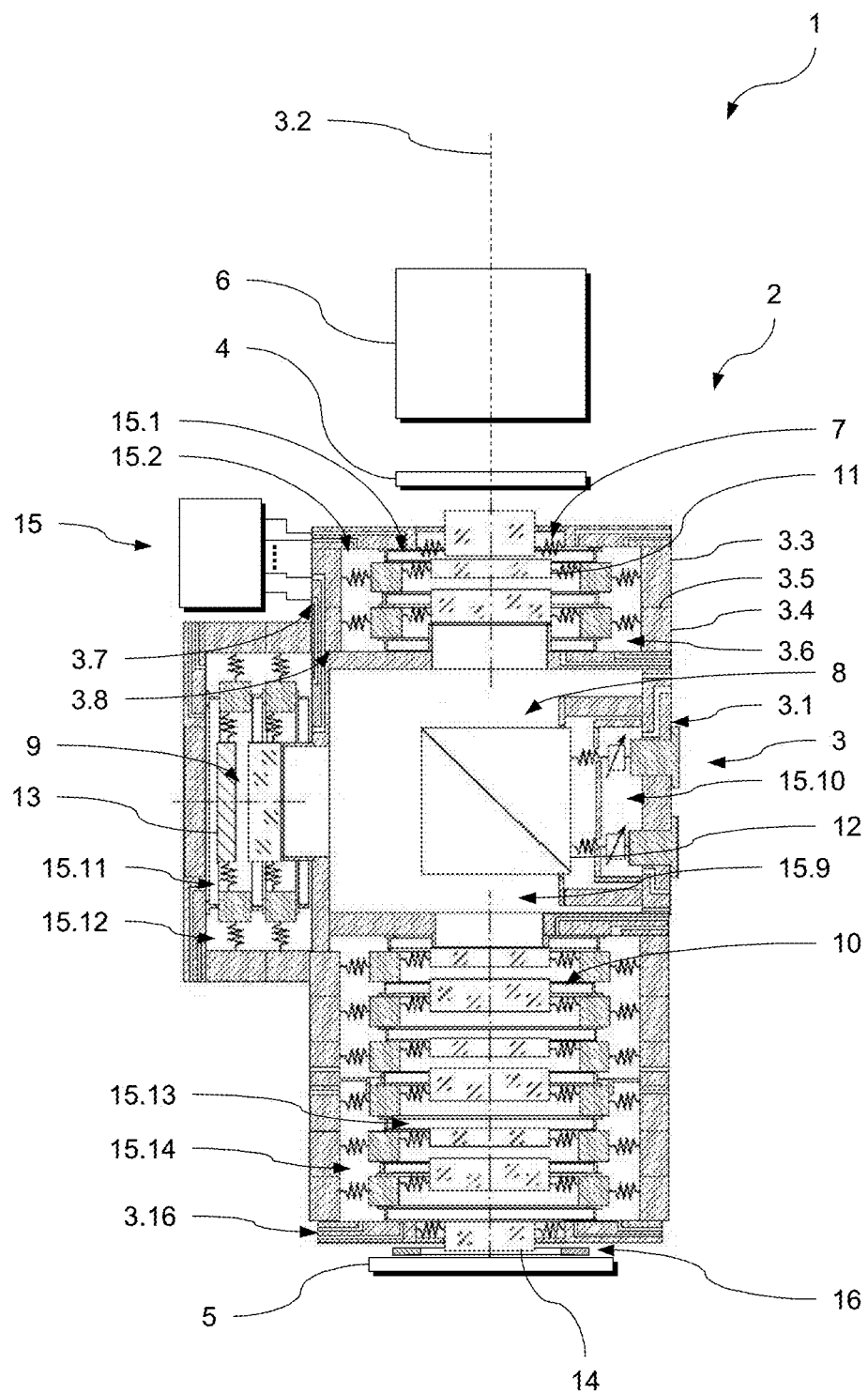
FIG. 1 is a schematic representation of an embodiment of an optical exposure apparatus according to the disclosure including an optical element unit according to the disclosure.

In the following, an embodiment of an optical exposure apparatus 1 according to the disclosure including an optical projection system 2 with an optical element unit 3 according to the disclosure will be described with reference to FIGS. 1 to 3.

The optical exposure apparatus 1 is adapted to transfer an image of a pattern formed on a mask 4 onto a substrate 5. To this end, the optical exposure apparatus 1 includes an illumination system 6 illuminating the mask 4 with exposure light and the optical element unit 3. The optical element unit 3 projects the image of the pattern formed on the mask 4 onto the substrate 5, e.g. a wafer or the like.

To this end, the optical element unit 3 holds a plurality of distinct optical element groups 7, 8, 9 and 10. These optical element groups 7, 8, 9 and 10 are held within a housing 3.1 of the optical element unit 3 along a folded optical axis 3.2. Each optical element group 7, 8, 9 and 10 includes one or a number of optical elements 11, 12, 13, 14, such as lenses, mirrors, gratings or the like.

It should be noted that the shape of the optical elements 11, 12, 13, 14 as well as the shape of the further components of the optical element unit 3 is extremely simplified in FIG. 1. It will be appreciated that, in reality, these components may be of an arbitrarily complex design. In particular, the optical elements 11, 12, 13, 14 may have curved surfaces of arbitrarily complex geometry.

The housing 3.1 is composed of a plurality of housing modules 3.3, 3.4 stacked and tightly connected to form the optical element unit 3. Each housing module 3.3, 3.4 holds one or more of the optical elements 11, 12, 13, and 14. The mechanical interfaces 3.5 of the housing modules 3.3, 3.4 are sealed to prevent intrusion of contaminants into the inner part 3.6 of the housing 3.1 which might otherwise contaminate and affect the optical elements 11, 12, 13, 14 and lead to a degradation of the imaging properties of the optical element groups 7, 8, 9 and 10.

To reduce the concentration of contaminants within the inner part 3.6 of the housing 3.1, a purging device 15 is provided. This purging device 15 is connected to the inner part 3.6 via a plurality of ducts—of which only a few are shown in FIGS. 1 and 2. As will be explained in further detail below, the purging device 15 establishes first and second purging flows within the housing 3.1 which draw off contaminants from the inner part 3.6 of the housing 3.1.

The optical projection system 2 receives the part of the light path of the exposure light between the mask 4 and the substrate 5. Its optical elements 11, 12, 13, 14 cooperate to transfer the image of the pattern formed on the mask 4 onto the substrate 5 located at the end of the light path. To increase the numerical aperture NA of the optical projection system 2, the optical projection system 2 may include an immersion zone 16 filled with an immersion medium such as highly purified water.

Figure 2:
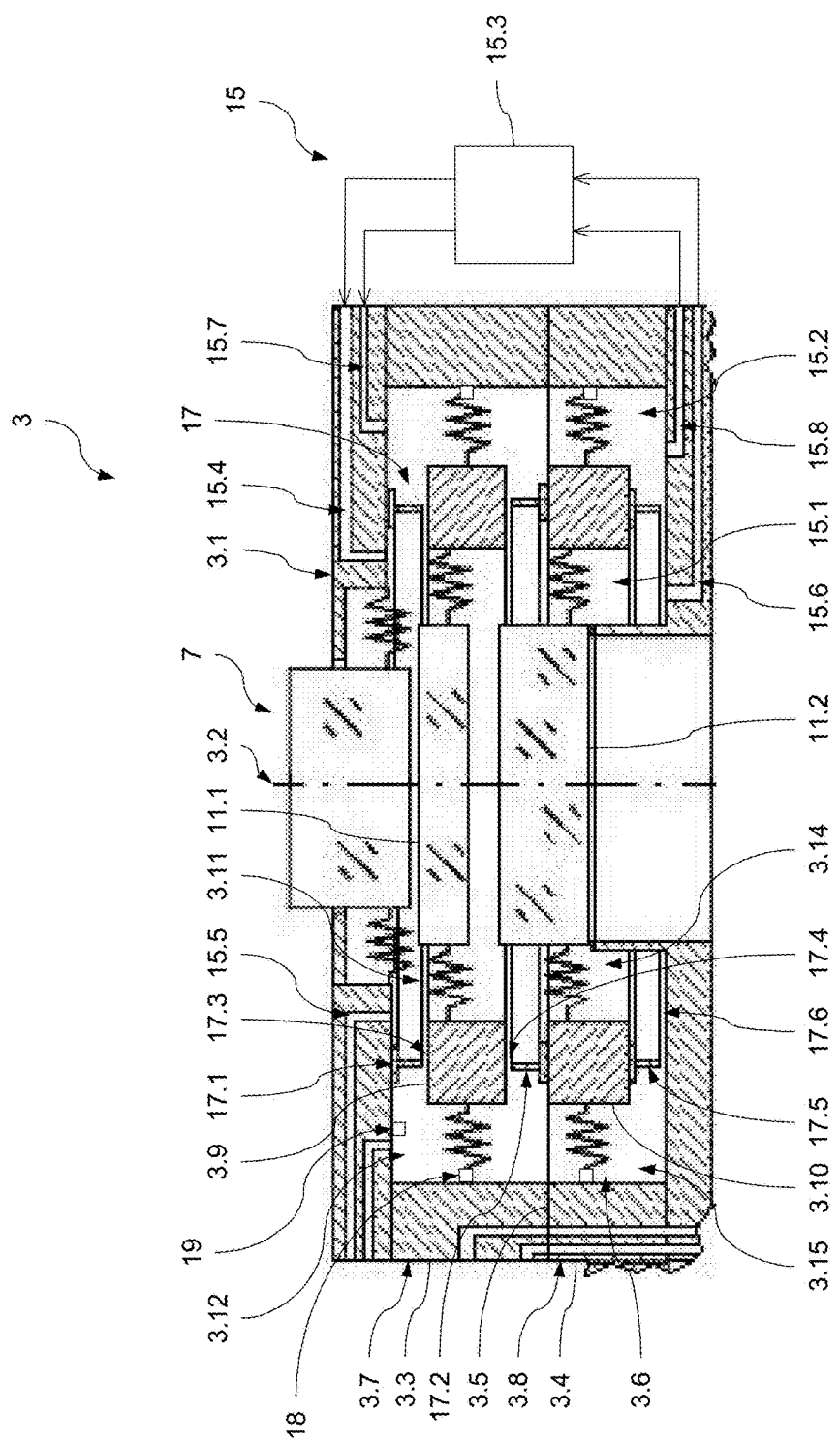
FIG. 2 is a schematic partial representation of a part of the optical element unit of FIG. 1.

FIG. 2 shows a schematic representation of the part of the housing 3.1 receiving the optical element group 7. The part of the optical element unit 3 receiving the optical element group 7 includes among others two optical element modules 3.7 and 3.8, each occupying a certain module space.

The first optical element module 3.7 includes the first housing module 3.3, a ring shaped first optical element holder 3.9 and a first optical element 11.1. The first optical element 11.1 is connected to the first optical element holder 3.9 by a suitable connector mechanism, e.g. three connectors. The first optical element holder 3.9, in turn, is connected to the first housing module 3.3 a suitable connector mechanism, e.g. three connectors. The first housing module 3.3 forms the outer wall of the first optical element module 3.7.

The second optical element module 3.8 includes the second housing module 3.4, a ring shaped second optical element holder 3.10 and a second optical element 11.2. The second optical element 11.2 is connected to the second optical element holder 3.10 by a suitable connector mechanism, e.g. three connectors. The second optical element holder 3.10, in turn, is connected to the second housing module 3.4 a suitable connector mechanism, e.g. three connectors. The second housing module 3.4 forms the outer wall of the second optical element module 3.8.

A sealing arrangement 17 separates the first module space of the first optical element module 3.7 into a first space 3.11 and a second space 3.12. The first space 3.11 substantially has the shape of a cylinder, while the second space 3.12 substantially has the shape of a hollow cylinder that is concentric with the cylindrical first space 3.11. Furthermore, the first space 3.11 receives the exposure light used in the exposure process while the second space 3.12 is substantially free of exposure light. In other words, the light path of the exposure light crosses the first space 3.11 while it does not cross or otherwise touch the second space 3.12.

To achieve this configuration, the sealing arrangement 17 includes two cylindrical sealing wall elements 17.1 and 17.2 having cylinder axes that are collinear with the axis 3.2. Both sealing wall elements 17.1 and 17.2 with one end nearly reach up to the first optical element holder 3.9, leaving a narrow circumferential sealing gap 17.3 and 17.4, respectively. At its respective other end, the first sealing wall element 17.1 is connected in a sealed manner to the housing 3.1 and the second sealing wall element 17.2 is connected in a sealed manner to the second optical element holder 3.10.

The sealing arrangement 17 also separates the second module space of the second optical element module 3.8 into a third space 3.14 and a fourth space 3.15. The third space 3.14 substantially has the shape of a cylinder, while the fourth space 3.15 substantially has the shape of a hollow cylinder that is concentric with the cylindrical third space 3.14.

To achieve this configuration, the sealing arrangement 17 includes a third cylindrical sealing wall element 17.5 having a cylinder axis that is also collinear with the axis 3.2. The third sealing wall element 17.5 with one end nearly reaches up to the housing 3.1, leaving a narrow circumferential sealing gap 17.6. At its other end, the third sealing wall element 17.5 is connected in a sealed manner to the second optical element holder 3.10.

The first space 3.11 and the third space 3.14 are in mutual communication and form a first purging space 15.1. In turn, the second space 3.12 and the fourth space 3.15 are in mutual communication and form a second purging space 15.2 in communication with the fourth space 3.15.

The first optical element 11.1, as a first component of the optical element unit 3 appertaining to a first component type, namely the type "optical elements" (i.e. consisting of optical elements cooperating with the exposure light exclusively), is received completely within the first space 3.11 and, thus, does not contact the second space 3.12. The second optical element 11.2, as a first component of the optical element unit 3 also appertaining to the first component type, contacts the third space 3.14 but does not contact the fourth space 3.15. In other words, the optical elements contact the first purging space 15.1 but do not contact the second purging space 15.2.

A plurality of second components—not shown in greater detail—such as actuators 18, sensors 19, and sealing devices sealing the interfaces 3.5, are mounted to the inner wall of the housing modules 3.3 and 3.4. Thus, these second components 18, 19 contact or are received within the second space 3.12 and the fourth space 3.15, respectively. These second components 18, 19 appertain to a second component type different from the first component type, namely a "non-optical-element type". These second components 18, 19 are often prone to release contaminants into the inner part 3.6 of the housing, e.g. by outgassing such contaminants.

The purging device 15 establishes a first purging flow in the first purging space 15.1 and a different second purging flow in the second purging space 15.2. This has the advantage that, on the one hand, the first purging flow established in the optically used region of the optical elements 11.1 and 11.2 may be of a relatively moderate flow rate and a relatively moderate flow velocity. Thus, turbulences etc. within the light path that might otherwise be detrimental to the imaging quality may be avoided at least to a large extent. On the other hand, the second purging flow established in the region not contacting the optical elements 11.1 and 11.2 may be of a relatively high flow rate and a relatively high flow velocity. Thus, a high removal rate of contaminants may be achieved directly at the location where they originate while not affecting imaging quality.

The purging device 15 is adapted to selectively control the first and second purging flow such that they may be continuously adjusted according to the current desired properties for the exposure process. To this end, the purging device 15 includes corresponding sensors which allow for the determination of these current desired properties.

A further advantage of this arrangement lies within the fact that the first purging flow contacting the highly sensitive optical elements 11.1 and 11.2 may be of higher purity than the second purging flow contacting less sensitive components. This leads to a less expensive purging model where a smaller amount of high purity purging medium is necessary than in conventional systems where the entire module space is usually purged with the same purging medium.

It will be appreciated that, with other embodiments of the disclosure, the second purging space may contact the optical elements in peripheral regions not optically used. In other words, it is only necessary that the second purging space does not contact the optical elements in their optically used areas to provide the beneficial effects of the disclosure. Furthermore, it will be appreciated that, with other embodiments of the disclosure, more than two different purging spaces may be formed in one module or section of the optical element unit. Thus an arbitrary number of separate purging flows may be established where appropriate.

The difference between the first purging flow and the second purging flow may lie only within the flow rate and/or the flow speed. Furthermore, the first purging medium of the first purging flow and the second purging medium of the second purging flow may be composed of the same or different chemical components. A further difference may lie within the concentration of the respective components.

The first purging flow is established by a ventilation unit 15.3 providing (only partially shown) the first purging medium to ducts 15.4 and 15.5 leading towards the first purging space 15.1. After passing the first purging space 15.1, the first purging medium is drawn off by the ventilation unit 15.3 via a duct 15.6.

The second purging flow is established by the ventilation unit 15.3 providing the second purging medium to a duct 15.7 leading towards the second purging space 15.2. After passing the second purging space 15.2, the second purging medium is drawn off by the ventilation unit 15.3 via a duct 15.8.

To prevent the intrusion of substances from the second purging space 15.2 into the first purging space 15.1 via the sealing gaps 17.3, 17.4 and 17.6, the sealing gaps 17.3, 17.4 and 17.6 have a width of about 10 to 30 µm. This already largely restricts the flow through the sealing gaps 17.3, 17.4 and 17.6. Furthermore, the ventilation unit 15.3 generates a first static pressure within the first purging space 15.1 that is slightly higher than a second static pressure generated within the second purging space 15.2. Thus, a slight leakage of first purging medium into the second purging space 15.2 is generated preventing such an intrusion of substances into the first purging space 15.1 via the sealing gaps 17.3, 17.4 and 17.6. Thus, in other words, the purging device 15 also forms part of the sealing arrangement 17.

However, it will be appreciated that, with other embodiments of the disclosure, the sealing gaps 17.3, 17.4 and 17.6 may be sealed by suitable sealing arrangements, e.g. flexible membranes, glues etc. In particular all the sealing arrangements that will be described in the following may be used to achieve such a sealing effect of the sealing gaps 17.3, 17.4 and 17.6.

Furthermore, the ventilation unit 15.3 controls the second static pressure generated within the second purging space 15.2 such that it is slightly higher than the pressure in the surrounding atmosphere outside the housing 3.1. This prevents or at least reduces the diffusion of components of the surrounding atmosphere into the second purging medium.

Further first purging spaces 15.9, 15.11 and 15.13 are formed and purged by the purging device 15 in a similar manner to the first purging space 15.1. Similarly, further second purging spaces 15.10, 15.12 and 15.14 are formed and purged by the purging device 15 in a similar manner to the second purging space 15.2. Thus, with respect to these further first and second purging spaces, it is here referred to the above.

The sections of the housing 3.1 holding the different optical element groups 7, 8, 9 and 10 are also mutually sealed from one another. This has the advantage that, in case one or several of the optical elements of these optical element groups 7, 8, 9 and 10 has to be exchanged or otherwise accessed form the exterior, the atmosphere in the other non-affected sections remains substantially unchanged. Thus, special purging protocols do only have to be followed for the affected section. This is particularly advantageous when regularly exchangeable optical components are provided such as the optical element 12 in FIG. 1.

Figure 3:
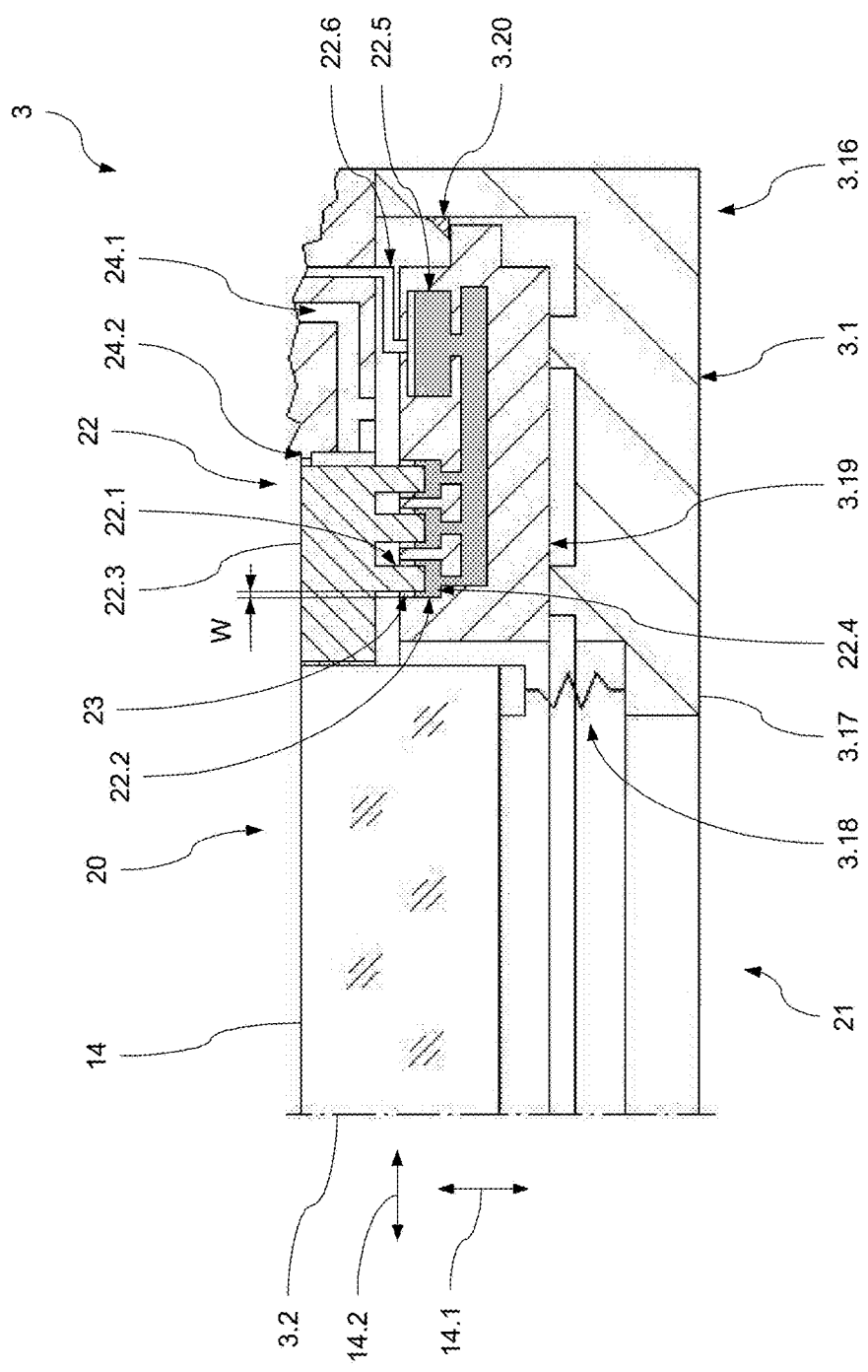
FIG. 3 is a schematic partial representation of a further part of the optical element unit of FIG. 1.

FIG. 3 shows a schematic but more detailed partial representation of a possible design of the last optical element module 3.16 of FIG. 1 holding the last optical element 14 of the optical element group 10. The last optical element 14 is held by a ring shaped last optical element holder 3.17 of the last optical element module 3.16. The last optical element 14 as a first component is connected to the associated last optical element holder 3.17 as a second component by a suitable connector mechanism, e.g. three connectors 3.18.

A first space 20 is formed at the inner part of the housing 3.1 adjacent to the last optical element 14 while a second space 21 is formed outside the housing 3.1 adjacent to the last optical element 14. A sealing device 22 is provided to seal a narrow sealing gap 23 formed between the last optical element 14 and the last optical element holder 3.17.

The sealing device 22 prevents the fluid exchange between the first space 20 and the second space 21 via the sealing gap 23. To this end, the sealing device 22 includes three protrusions in the form of concentric annular ribs 22.1, each reaching into one annular groove 22.2 in a ring shaped part 3.19 of the last optical element holder 3.17. The ribs 22.1 are formed on a ring shaped ring element 22.3 adhesively connected to the outer circumference of the last optical element 14.

To avoid the introduction of thermally induced stresses into the last optical element 14 due to differences in the coefficient of thermal expansion of the last optical element 14 and the ring element 22.3, the coefficient of thermal expansion of the element 22.3 is adapted to the coefficient of thermal expansion of the last optical element 14. However, it will be appreciated that, with other embodiments of the disclosure, the protrusions may also be directly formed on the last optical element.

An annular sealing gap 23 is formed between each rib 22.1 and its associated groove 22.2. The sealing gaps 23 form part of a passageway between the first space 20 and the second space 21. To prevent fluid exchange between the first space 20 and the second space 21, each sealing gap is filled with a viscous fluid 22.4 forming a sealing element obstructing the passageway between the first space 20 and the second space 21.

The viscous fluid 22.4 has the advantage that, due to its viscosity, it may not introduce static forces into the ring element 22.3 and thus the last optical element 14 either in the axial direction 14.1 of the last optical element 14 or in the radial direction 14.2 of the optical element. Thus, the sealing device 22 prevents the introduction of static forces into the last optical element 14. In other words, the sealing device 22 has a rigidity that is zero in a substantially static load situation.

It will be appreciated that the viscous fluid 22.4, depending on its viscosity, may have a dynamic rigidity other than zero. This rigidity typically depends on the velocity of the relative motion between the ribs 22.1 and the part 3.19 of the holder 3.17. However, it should be noted that, typically, relative motions of a non negligible amplitude only occur due to differences in the thermal expansion between the ring element 22.3 and the holder 3.17. These relative motions generally are rather slow such that dynamic aspects may usually be neglected.

In order to keep the viscous fluid 22.4 within the sealing gap 23, the gap width W transverse to the passageway formed by the sealing gap 23 is kept as low as possible. Preferably, the gap width W is less than 200 µm. Such a low gap width, on the one hand reduces the free surface of the viscous fluid 22.4 and, thus, evaporation effects that might gradually lead to a loss of the sealing effect.

To further prevent such a gradual loss of the sealing effect, a buffer reservoir 22.5 with viscous fluid is provided. The buffer reservoir 22.5 is in fluid communication with the grooves 22.2 to compensate for evaporation effects etc. The buffer reservoir 22.5 may be refilled from time to time via a flexible refill line 22.6.

To prevent contamination of the optical element 14 and further optical elements within the housing 3.1 an exhaust line 24.1 and a restrictor element 24.2 is provided. The exhaust line 24.1 is connected to the ventilation unit 15.3 that draws off gaseous substances, e.g. evaporation products of the viscous fluid 22.4, via the exhaust line 24.1. The restrictor element 24.2 guarantees that the gaseous substances are predominantly drawn off via the exhaust line 24.1.

On the other hand, the low gap width has the effect that capillary effects and surface forces keep the viscous fluid 22.4 within the sealing gap 23 even at considerable pressure differences between the first space 20 and the second space 21. In case the capillary effects draw the viscous fluid that far up that it leaves the groove 22.2, the groove may gradually widen at its upper end to reduce or prevent this effect.

To allow for a radial adjustment of the last optical element 14 while maintaining the proper sealing effect, the part 3.19 of the holder 3.17 may also be adjusted in the radial direction 14.2 of the last optical element 14. Thus, the sealing gap 23 may be adjusted to its optimum width W at any point in time. The adjustable part 3.19 is sealed against the holder 3.17 by a suitable sealing element 3.20, e.g. an elastic sealing glue or the like.

It will be appreciated that, with other embodiments of the disclosure, another number of protrusions and associated grooves filled with viscous fluid may be chosen. In particular, one single protrusion with an associated groove filled with viscous fluid may be sufficient.

It will be further appreciated that any suitable viscous fluid may be used. For example, Teflon® (PTFE) grease, e.g. PTFE particles in Perfluoropolyethers (PFPE) such as the ones sold by Solvay Solexis Inc., Thorofare, N.J. 08086, US, under the trademark Fomblin®, or even highly purified water, e.g. used also as the immersion medium, may be used.

In the following, preferred embodiments of a method of sealing a first space of an optical element unit versus a second space of the optical element unit according to the disclosure will be described with reference to FIGS. 1 to 4.

Figure 4:
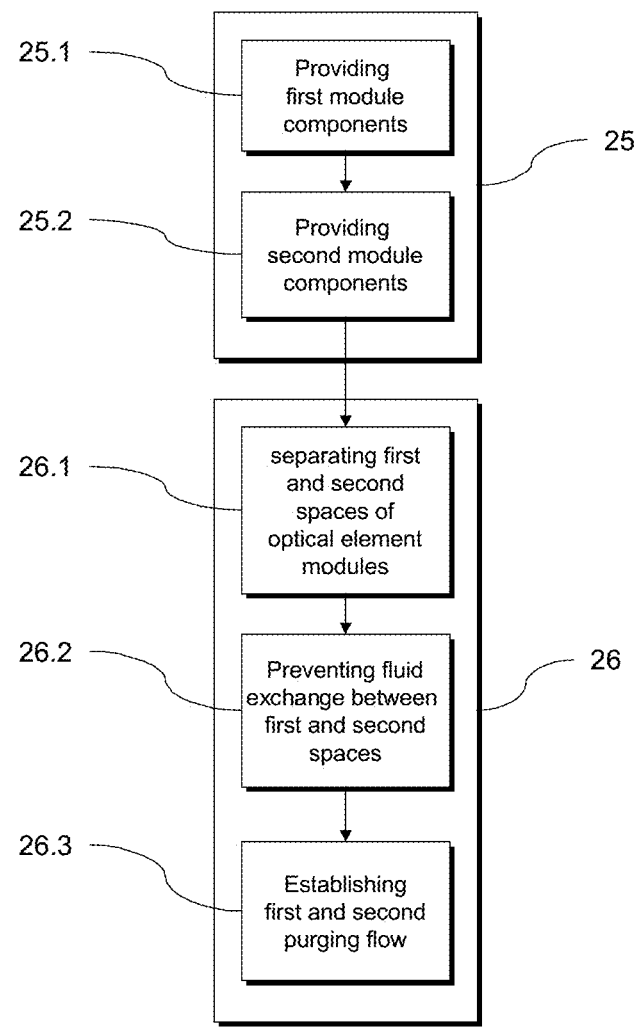
FIG. 4 is a block diagram of a method of sealing a first space of an optical element unit versus a second space of the optical element unit executed with the optical element unit of FIG. 1.

FIG. 4 shows a block diagram of a preferred embodiment of a method of sealing a first space of an optical element unit versus a second space of the optical element unit according to the disclosure that is used during operation of the optical exposure apparatus 1, i.e. when the image of the pattern formed on the mask 4 is transferred onto the substrate 5 using the optical element unit 3 projecting the image of the pattern formed on the mask 4 onto the substrate 5.

In a first step 25, the optical element unit 3 including a plurality of optical element modules 3.7, 3.8, 3.16 is provided. At least one of these optical element modules 3.7, 3.8, 3.16 includes a first module component 11.1, 11.2, 14 of a first type, namely the type "optical elements", and an associated second module component of a different second type, namely an actuator 18, a sensor 19 and an optical element holder 3.17, as it has been described above in the context of FIGS. 2 and 3. The first module component 11.1, 11.2 is provided in a step 25.1, while the second module component 18, 19, 3.17 is provided in a step 25.2.

In a step 26.1 of a second step 26, a sealing arrangement 17 is provided to separate the module spaces occupied by the optical element modules 3.7, 3.8 into first, second, third and fourth spaces to provide first and second purging spaces 15.1 and 15.2 as it has been described above in the context of FIGS. 1 and 2.

In a step 26.2, a sealing device 22 is provided to prevent fluid exchange between the fluid exchange between the first space 20 and the second space 21 while preventing the introduction of static forces into the last optical element 14 as it has been described above in the context of FIGS. 1 and 3.

In a step 26.3, the purging device 15 establishes a first purging flow in the first purging space 15.1 and a different second purging flow in the second purging space 15.2 as it has been described above in the context of FIGS. 1 and 2.

It will be appreciated that the above method for sealing the first space 20 of the optical element unit 3 versus the second space 21 of the optical element unit 3 may also be used during manufacture of the optical element unit 3 and the optical exposure apparatus 1, respectively.

In the following, an embodiment of an optical element unit 103 according to the disclosure will be described with reference to FIG. 5. The optical element unit 103 is largely identical with the optical element unit 3 of FIG. 1. The only difference lies within the design of the last optical element module 103.16 that replaces the last optical element module 3.16 of FIGS. 1 and 3. Thus, it will here only be referred to these differences.

Figure 5:
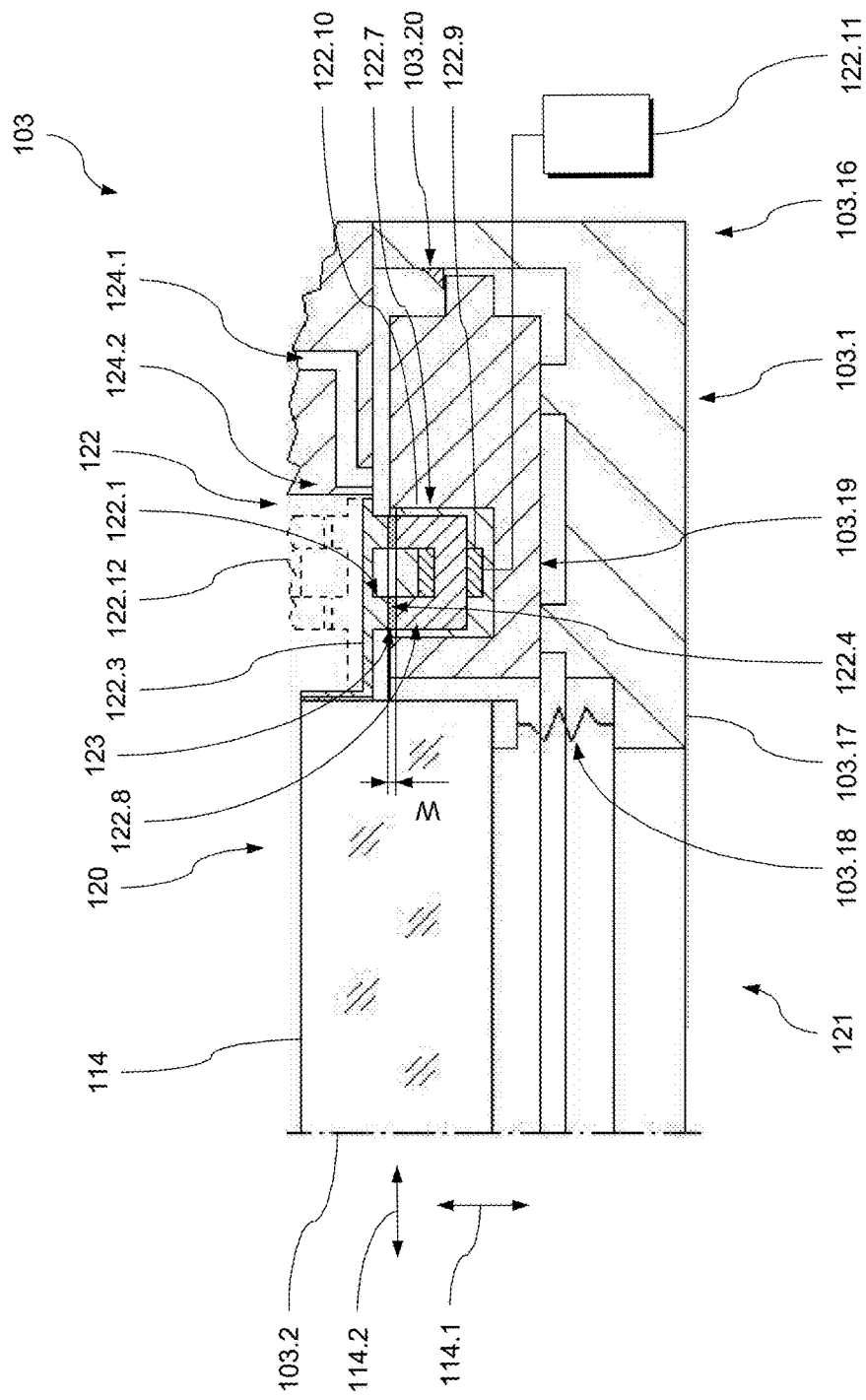
FIG. 5 is a schematic partial representation of an embodiment of an optical element unit according to the disclosure.

FIG. 5 shows a schematic partial representation of the last optical element module 103.16 holding the last optical element 114 of the optical element group 10 of FIG. 1. The last optical element 114 is held by a ring shaped last optical element holder 103.17 of the last optical element module 103.16. The last optical element 114 as a first component is connected to the associated last optical element holder 103.17 as a second component by a suitable connector mechanism, e.g. three connectors 103.18.

A first space 120 is formed at the inner part of the housing 103.1 adjacent to the last optical element 114 while a second space 121 is formed outside the housing 103.1 adjacent to the last optical element 114. A sealing device 122 is provided to seal a narrow sealing gap 123 formed between the last optical element 114 and the last optical element holder 103.17.

The sealing device 122 prevents the fluid exchange between the first space 120 and the second space 121 via the sealing gap 123. To this end, the sealing device 122 includes two protrusions in the form of concentric annular ribs 122.1 formed on a ring shaped ring element 122.3, an electromagnetic device 122.7, and a sealing element formed by an annular layer of a magneto-rheological fluid 122.4 (like a magneto-fluid liquid or gel) arranged between each annular rib 122.1 and the electromagnetic device 122.7.

Each rib 122.1 nearly reaches up to an end portion of an annular core 122.8 of the electromagnetic device 122.7. The electromagnetic device 122.7 is arranged in a ring shaped part 103.19 of the last optical element holder 103.17. The core 122.8 is of generally U-shaped cross-section. In its central section, the core is flanked by windings 122.9 used to generate an adjustable magnetic field in the core 122.8. The core 122.8 and the windings 122.9 are embedded within an electromagnetic shield 122.10 of the electromagnetic device 122.7. The magnetic field within the core 122.8 is adjusted via a controller unit 122.11 of the electromagnetic device 122.7 adjusting the direction and the level of the current within the windings 122.9.

The ribs 122.1 are formed on a ring shaped ring element 122.3 adhesively connected to the outer circumference of the last optical element 114. To avoid the introduction of thermally induced stresses into the last optical element 114 due to differences in the coefficient of thermal expansion of the last optical element 114 and the ring element 122.3, the coefficient of thermal expansion of the element 122.3 is adapted to the coefficient of thermal expansion of the last optical element 114. However, it will be appreciated that, with other embodiments of the disclosure, the protrusions may also be directly formed on the last optical element.

As mentioned above, an annular sealing gap 123 is formed between each rib 122.1 and its associated end section of the core 122.8. The sealing gaps 123 form part of a passageway between the first space 120 and the second space 121. To prevent fluid exchange between the first space 120 and the second space 121, each sealing gap is filled with a magneto-rhelogical viscous fluid 122.4 forming a sealing element obstructing the passageway between the first space 120 and the second space 121.

The viscous fluid 122.4 has the advantage that, due to its viscosity, it may not introduce static forces into the ring element 122.3 and thus the last optical element 114 either in the axial direction 114.1 of the last optical element 114 or in the radial direction 114.2 of the optical element. Thus, the sealing device 122 prevents the introduction of static forces into the last optical element 114. In other words, the sealing device 122 has a rigidity that is zero in a substantially static load situation.

Furthermore, the magneto-rhelogical viscous fluid 22.4 has the advantage that, due to its magneto-rhelogical properties, its viscosity may be adjusted via the magnetic field generated by the electromagnetic device 122.7. Thus, in situations where a continued considerable pressure difference between the first space 120 and the second space 121 is to be expected that might eventually expel the viscous fluid 122.4 from the respective sealing gap 123, the viscosity may be raised via the magnetic field to counteract this effect. This has the advantage that less effort is necessary in terms of the design of the sealing gap 123 while maintaining the sealing effect. For example, less strict tolerances have to be respected in the context of size and uniformity of the sealing gap 123.

Such situations with a continued considerable pressure difference are to be expected during mounting and transport of the optical element unit 103. In these situations, the viscosity of the viscous fluid 122.4 may be raised by the controller unit 122.11 via the magnetic field while, in other situations, e.g. during normal operation of the optical element unit 103, another viscosity level may be selected. In general, the viscosity level may be selected continuously as a function of the pressure difference measured by a suitable mechanism connected to the controller unit 122.11. Depending on the magneto-rhelogical properties of the fluid 122.4, this may be done by turning off the magnetic field within the core 122.8 completely or by raising or lowering the magnetic field, in particular, by turning off the magnetic field completely. It will be appreciated that a permanent magnet may be provided, e.g. as a part of the core, to maintain a certain magnetic field in the area of the viscous fluid 122.4 when the electromagnetic device 122.7 is turned of or fails.

It will be appreciated that the viscous fluid 122.4, depending on its viscosity, may have a dynamic rigidity other than zero. This rigidity typically depends on the velocity of the relative motion between the ribs 122.1 and the part 103.19 of the holder 103.17. However, it should be noted that, typically, relative motions of a non negligible amplitude only occur due to differences in the thermal expansion between the ring element 122.3 and the holder 103.17. These relative motions generally are rather slow dynamic aspects may usually be neglected.

Furthermore, the ring element 122.3 may be a relatively thin component that is particularly compliant in the axial direction 114.1 of the optical element 114 in order to strongly reduce the introduction of forces into the optical element 114 due to misalignments of the components.

In order to keep the viscous fluid 122.4 within the sealing gap 123, the gap width W transverse to the passageway formed by the sealing gap 123 is kept as low as possible. Preferably, the gap width W is less than 200 µm. Such a low gap width, on the one hand reduces the free surface of the viscous fluid 122.4 and, thus, evaporation effects that might gradually lead to a loss of the sealing effect.

It will be appreciated that, to further prevent such a gradual loss of the sealing effect, an additional buffer reservoir with viscous fluid may be provided as it has been described in the context of FIG. 3.

To prevent contamination of the optical element 114 and further optical elements within the housing 103.1 an exhaust line 124.1 and a restrictor element 124.2 is provided. The exhaust line 124.1 is connected to the ventilation unit 15.3 that draws off gaseous substances, e.g. evaporation products of the viscous fluid 122.4, via the exhaust line 124.1. The restrictor element 124.2 guarantees that the gaseous substances are predominantly drawn off via the exhaust line 124.1.

On the other hand, with the viscosity adjusted properly, the low gap width has the effect that capillary effects and surface forces keep the viscous fluid 122.4 within the sealing gap 123 even at considerable pressure differences between the first space 120 and the second space 121. In case the capillary effects draw the viscous fluid that far that it leaves the sealing gap 123, the sealing gap 123 may gradually widen at its ends to reduce or prevent this effect.

To allow for a radial adjustment of the last optical element 114 while maintaining the proper sealing effect, the part 103.19 of the holder 103.17 may also be adjusted in the radial direction 114.2 of the last optical element 114. Thus, the sealing gap 123 may be adjusted to its optimum width W at any point in time. The adjustable part 103.19 is sealed against the holder 103.17 by a suitable sealing element 103.20, e.g. an elastic sealing glue or the like.

It will be appreciated that, with other embodiments of the disclosure, a two-sided sealing arrangement may be realized. Such a two-sided sealing arrangement may include a second electromagnetic device and second ring shaped layers of magneto-rheological viscous fluid arranged on an opposite side the ring element 122.3 as it is indicated in FIG. 5 by the dashed contour 122.12. Again, the ring element may then be formed by the optical element itself. Finally, it will be appreciated that, eventually, one single ring of magneto-rheological viscous fluid may be sufficient to seal the sealing gap.

It will be further appreciated that any suitable magneto-rheological viscous fluid may be used. For example, a magneto-rheological viscous fluid such as VSG 303 sold by Ferrotec GmbH, 72669 Unterensingen, may be used.

It will be further appreciated that the methods of sealing a first space of an optical element unit versus a second space of the optical element unit according to the disclosure as they have been described above in the context of FIGS. 1 to 4 may be executed with this optical element unit 103 as well. Thus, in this context, it is here only referred to the above explanations.

It will be further appreciated that, instead of or in addition to the magneto-rheological fluid, an electro-rheological viscous fluid (such as a liquid or a gel) may be used to seal the sealing gap. In this case, of course, an appropriate device generating appropriate electric fields for controlling the viscosity of the electro-rheological viscous fluid is provided.

Finally, it will be appreciated that, instead of or in addition to the magneto-rheological fluid and/or the electro-rheological viscous fluid, inflatable seals may be used to seal the sealing gap. In this case, of course, an appropriate device generating the appropriate pressure within the inflatable seal is provided.

In the following, an embodiment of an optical element unit 203 according to the disclosure will be described with reference to FIG. 6. The optical element unit 203 is largely identical with the optical element unit 3 of FIG. 2. The only difference lies within the design of the last optical element module 203.16 that replaces the last optical element module 3.16 of FIGS. 2 and 3. Thus, it will here only be referred to these differences.

Figure 6:
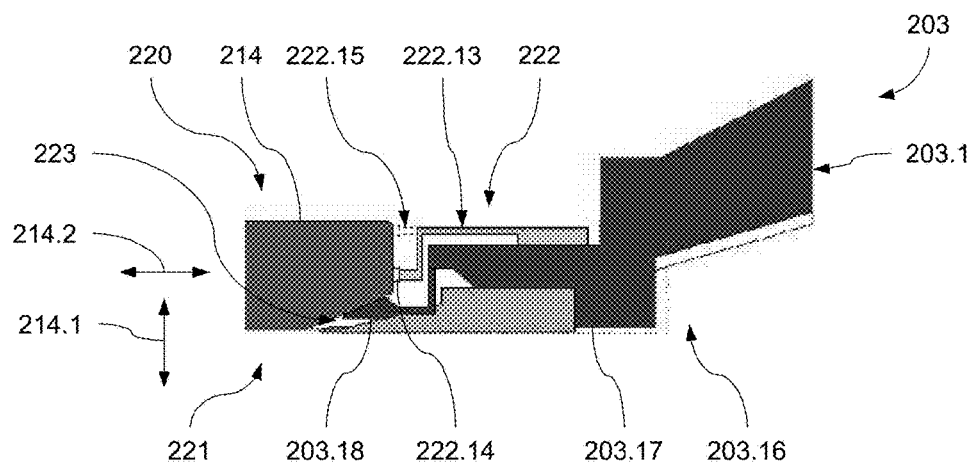
FIG. 6 is a schematic partial representation of an embodiment of an optical element unit according to the disclosure.

FIG. 6 shows a schematic partial representation of the last optical element module 203.16 holding the last optical element 214 of the optical element group 10 of FIG. 1.

The last optical element 214 is held by a ring shaped last optical element holder 203.17 of the last optical element module 203.16. The last optical element 214 as a first component is connected to the associated last optical element holder 203.17 as a second component by a suitable connector mechanism, e.g. three connectors 203.18.

Apart from the locations where the connectors 203.18 contact the last optical element 214, a circumferential sealing gap 223 is formed between the last optical element 214 and the last optical element holder 203.17.

At a first end of the sealing gap 223, a first space 220 is formed at the inner part of the housing 203.1 adjacent to the last optical element 214. At a second end of the sealing gap 223, a second space 221 is formed outside the housing 203.1 adjacent to the last optical element 214.

A sealing device 222 is provided to prevent fluid exchange between the first space 220 and the second space 221 via the sealing gap 223 while, at the same time substantially preventing the introduction of forces in the axial direction 214.1 and the radial direction 214.2 of the last optical element 214 via the sealing device 222.

To this end, the sealing device 222 includes a ring shaped thin metallic membrane element 222.13. The membrane element 222.13 is adhesively coupled to the last optical element 214 via a ring of conventional sealing glue 222.14, e.g. a soft elastic sealing compund on polyurethane (PUR) basis with filler material. The sealing glue ring 222.14 extends at the outer circumference of the last optical element 214 and forms a fluid tight connection between the membrane element 222.13 and the last optical element 214. At its outer circumference, the membrane element 222.13 is coupled to the last optical element holder 203.17. Here as well, a fluid tight connection is realized in any suitable known manner, e.g. adhesively, in a positive connection (also known as interlocking connection) or a frictional connection or combinations thereof.

The low thickness of the membrane element 222.13 provides for a good deformation decoupling between the last optical element 214 and the last optical element holder 203.17 in the axial direction 214.1. To provide for the deformation decoupling between the last optical element 214 and the last optical element holder 203.17 in the radial direction 214.1, the membrane element 222.13 has a stepped or undulated design in the radial direction. It will be appreciated that, as a general rule, the deformation decoupling properties increase with the number of steps or undulations.

It will be appreciated that deformation decoupling in this context means that local or global shifts introduced into the deformation decoupling element, here the membrane element 222.13, will mainly result in a deformation of the deformation decoupling element that will substantially not introduce forces resulting from these shifts into the optical element.

It will be appreciated that the necessary design of the membrane element 222.13 and, thus, its necessary deformation decoupling properties may depend on the intended field of use of the last optical element. In the case of a use in a microlithograpy application, stricter desird properties may be valid that for other less imaging accuracy driven applications. Depending on the intended field of use of the respective optical element, a maximum level of admissible deformation may be defined and, thus, also an inadmissible force level above which the forces introduced into the optical element lead to inadmissible deformations of the optical element.

Depending on this inadmissible force level the desired deformation decoupling properties of the membrane element may be defined. Thus, in more robust applications, a straight substantially planar membrane element as it is indicated in FIG. 6 by the dashed contour 222.15 may be sufficient.

Even within the field of microlithograpy applications, considerable differences may exist which, in particular, depend on the wavelength of the light used in the exposure process. Preferably, the membrane element 222.13 has a rigidity in a range from 0.1 N/mm to 10 N/mm in the axial direction 214.1 and the radial direction 214.2. With further preferred embodiments the rigidity is even below 0.1 N/mm in the axial direction 214.1 and the radial direction 214.2. Furthermore, preferably, the rigidity of the membrane element 222.13 is selected such that, during normal operation of the optical element unit 203, e.g. in a normal exposure process, the maximum force introduced into the last optical element 214 via the sealing device 222 is less than 0.01 N, both, in the axial direction 214.1 and the radial direction 214.2.

Contrary to conventional designs, where the sealing glue often directly connects the optical element to the associated optical element holder, the arrangement of FIG. 6 has the further advantage that deformations of the sealing glue 222.14, e.g. due to expansion or shrinkage effects etc., are introduced into and taken up by the membrane element 222.13. In other words, due to the low rigidity of the membrane element 222.13, the deformations are substantially not transferred to the optical element holder and, thus, may substantially not result in any reaction forces introduced via the membrane element 222.13 back into the optical element 214.

It will be further appreciated that any suitable metal may be used for the membrane element 222.13. Preferably, the coefficient of thermal expansion of the membrane element 222.13 is adapted in a known manner to the coefficient of thermal expansion of the optical element 214 in order to avoid the introduction of thermally induced forces into the optical element 214.

It will be appreciated that the methods of sealing a first space of an optical element unit versus a second space of the optical element unit according to the disclosure as they have been described above in the context of FIGS. 1 to 4 may be executed with this optical element unit 203 as well. Thus, in this context, it is here only referred to the above explanations.

In the following, an embodiment of an optical element unit 303 according to the disclosure will be described with reference to FIG. 7. The optical element unit 303 is largely identical with the optical element unit 203 of FIG. 6. The main difference lies within the design of the sealing device 322 that replaces the sealing device 222 of FIG. 6.

Figure 7:
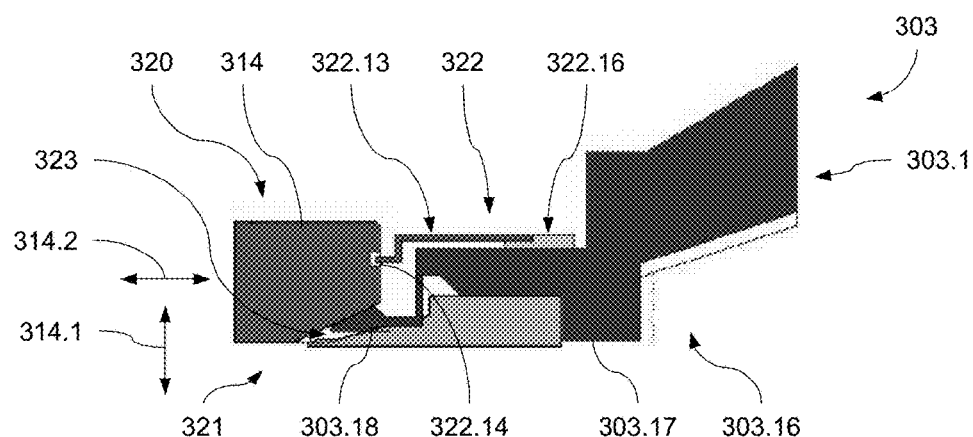
FIG. 7 is a schematic partial representation of an embodiment of an optical element unit according to the disclosure.

FIG. 7 shows a schematic partial representation of the last optical element module 303.16 holding the last optical element 314 of the optical element group 10 of FIG. 1. The last optical element 314 is held by a ring shaped last optical element holder 303.17 of the last optical element module 303.16. The last optical element 314 as a first component is connected to the associated last optical element holder 303.17 as a second component by a suitable connector mechanism, e.g. three connectors 303.18.

Apart from the locations where the connectors 303.18 contact the last optical element 314, a circumferential sealing gap 323 is formed between the last optical element 314 and the last optical element holder 303.17.

At a first end of the sealing gap 323, a first space 320 is formed at the inner part of the housing 303.1 adjacent to the last optical element 314. At a second end of the sealing gap 323, a second space 321 is formed outside the housing 303.1 adjacent to the last optical element 314.

A sealing device 322 is provided to prevent fluid exchange between the first space 320 and the second space 321 via the sealing gap 323 while, at the same time substantially preventing the introduction of forces in the axial direction 314.1 and the radial direction 314.2 of the last optical element 314 via the sealing device 322.

To this end, the sealing device 322 includes an elastic ring shaped thin polymeric membrane element 322.13. The membrane element 322.13 is adhesively coupled to the last optical element 314 via a ring of conventional sealing glue 322.14, e.g. a soft elastic sealing compound on polyurethane (PUR) basis with filler material. The sealing glue ring 322.14 extends in a groove at the outer circumference of the last optical element 314 and forms a fluid tight connection between the membrane element 322.13 and the last optical element 314. At its outer circumference, the membrane element 322.13 is coupled to the last optical element holder 303.17 via a contact ring 322.16 of any suitable material. Here as well, a fluid tight connection is realized in any suitable known manner, e.g. adhesively, in a positive or a frictional connection or combinations thereof.

The low thickness of the membrane element 322.13 provides for a good deformation decoupling between the last optical element 314 and the last optical element holder 303.17 in the axial direction 314.1. To provide for the deformation decoupling between the last optical element 314 and the last optical element holder 303.17 in the radial direction 314.1, the membrane element 322.13 again has a stepped or undulated design in the radial direction. It will be appreciated that, as a general rule, at equal thickness, the deformation decoupling properties of the polymeric membrane element 322.13 clearly exceed the deformation decoupling properties of the metallic membrane element 222.13 of FIG. 6.

It will be further appreciated that any suitable polymeric material may be used for the membrane element 322.13. Such materials may be natural or synthetic rubber (e.g. known as NR, ISOPRENE, IR), Polychloropene (e.g. known as NEOPRENE, CR), Nitrile and Hydrogenated Nitrile (e.g. known as NBR, HNBR BUNA N), Ethylene Propylene (e.g. known as NORDEL, EPM, EPDM), Fluor elastomerics (e.g. known as VITON, FKM), Perfluor elastomerics (e.g. known as KALREZ, FFKM, CHEMRAZ).

It will be appreciated that the methods of sealing a first space of an optical element unit versus a second space of the optical element unit according to the disclosure as they have been described above in the context of FIGS. 1 to 4 may be executed with this optical element unit 303 as well. Thus, in this context, it is here only referred to the above explanations.

In the following, an embodiment of an optical element unit 403 according to the disclosure will be described with reference to FIG. 8. The optical element unit 403 is largely identical with the optical element unit 203 of FIG. 6. The main difference lies within the design of the sealing device 422 that replaces the sealing device 222 of FIG. 6.

Figure 8:
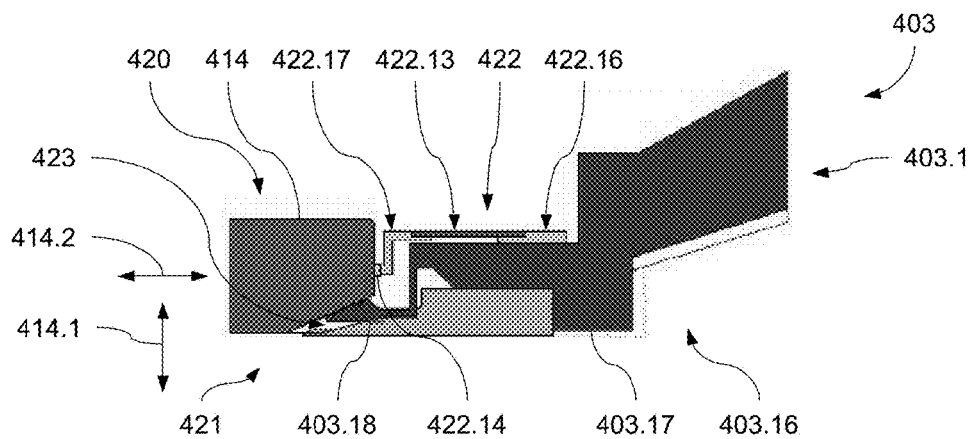
FIG. 8 is a schematic partial representation of an embodiment of an optical element unit according to the disclosure.

FIG. 8 shows a schematic partial representation of the last optical element module 403.16 holding the last optical element 414 of the optical element group 10 of FIG. 1. The last optical element 414 is held by a ring shaped last optical element holder 403.17 of the last optical element module 403.16. The last optical element 414 as a first component is connected to the associated last optical element holder 403.17 as a second component by a suitable connector mechanism, e.g. three connectors 403.18.

Apart from the locations where the connectors 403.18 contact the last optical element 414, a circumferential sealing gap 423 is formed between the last optical element 414 and the last optical element holder 403.17.

At a first end of the sealing gap 423, a first space 420 is formed at the inner part of the housing 403.1 adjacent to the last optical element 414. At a second end of the sealing gap 423, a second space 421 is formed outside the housing 403.1 adjacent to the last optical element 414.

A sealing device 422 is provided to prevent fluid exchange between the first space 420 and the second space 421 via the sealing gap 423 while, at the same time substantially preventing the introduction of forces in the axial direction 414.1 and the radial direction 414.2 of the last optical element 414 via the sealing device 422.

To this end, the sealing device 422 includes a substantially plane elastic ring shaped thin polymeric membrane element 422.13. Here, the membrane element 422.13 is coupled at its inner circumference to a stepped metallic inner ring 422.17 of the sealing device 422. This inner ring 422.17, in turn, is adhesively coupled to the last optical element 414 via a ring of conventional sealing glue 422.14, e.g. a soft elastic sealing compound on polyurethane (PUR) basis with filler material. The sealing glue ring 422.14 extends at the outer circumference of the last optical element 414 and forms a fluid tight connection between inner ring 422.17 and the last optical element 414. At its outer circumference, the membrane element 422.13 is coupled to the last optical element holder 403.17 via a contact ring 422.16 of any suitable material. At the connection locations between the membrane element 422.13 and the inner ring 422.17 and the contact ring 422.16, a fluid tight connection is realized in any suitable known manner, respectively, e.g. adhesively, in a positive or a frictional connection or combinations thereof.

The low thickness of the membrane element 422.13 provides for a good deformation decoupling between the last optical element 414 and the last optical element holder 403.17 in the axial direction 414.1. The polymeric material and the thickness of the membrane element 422.13 are selected to provide for a sufficient deformation decoupling between the last optical element 414 and the last optical element holder 403.17 in the radial direction 414.1 as well. Again, this is done as a function of the intended field of use of the optical element 414 and its maximum admissible deformations during this intended use.

The inner ring 422.17 has the advantage that shrinkage or distortion processes that may occur after the manufacture of the membrane element 422.13, e.g. due to residual polymerization or hardening of the polymeric material, do not lead to a considerable distortion of the sealing device 422 that might affect the deformation decoupling properties of the sealing device 422. This is of particular advantage in the context of microlithography applications where geometric tolerances of less than 10 μm are usually desired.

Furthermore, the inner ring 422.17 is designed as a thin compliant component with a rigidity that is negligible in relation to the rigidity of the optical element to show itself good deformation decoupling properties. Finally, it will be appreciated that any suitable metal may be used for the inner ring 422.17. Preferably, the coefficient of thermal expansion of the inner ring 422.17 is adapted in a known manner to the coefficient of thermal expansion of the optical element 414 in order to avoid the introduction of thermally induced forces into the optical element 414. Where quartz ($SiO_2$) lenses are used as the optical elements 414, Invar may be selected as the metal, while certain steels or brass may be used in combination with calcium fluoride ($CaF_2$) lenses It will be appreciated that, with other embodiments of the disclosure, the membrane element may again have a stepped or undulated design in the radial direction to increase the deformation decoupling properties of the polymeric membrane element as it will be described in the following with reference to FIG. 9.

It will be further appreciated that any suitable polymeric material may be used for the membrane element 422.13. Such materials may be natural or synthetic rubber (e.g. known as NR, ISOPRENE, IR), Polychloropene (e.g. known as NEOPRENE, CR), Nitrile and Hydrogenated Nitrile (e.g. known as NBR, HNBR BUNA N), Ethylene Propylene (e.g. known as NORDEL, EPM, EPDM), Fluor elastomerics (e.g. known as VITON, FKM), Perfluor elastomerics (e.g. known as KALREZ, FFKM, CHEMRAZ).

It will be further appreciated that the methods of sealing a first space of an optical element unit versus a second space of the optical element unit according to the disclosure as they have been described above in the context of FIGS. 1 to 4 may be executed with this optical element unit 403 as well. Thus, in this context, it is here only referred to the above explanations.

In the following, an embodiment of an optical element unit 503 according to the disclosure will be described with reference to FIG. 9. The optical element unit 503 is largely identical with the optical element unit 403 of FIG. 8. The main difference lies within the design of the sealing device 522 that replaces the sealing device 422 of FIG. 8.

Figure 9:
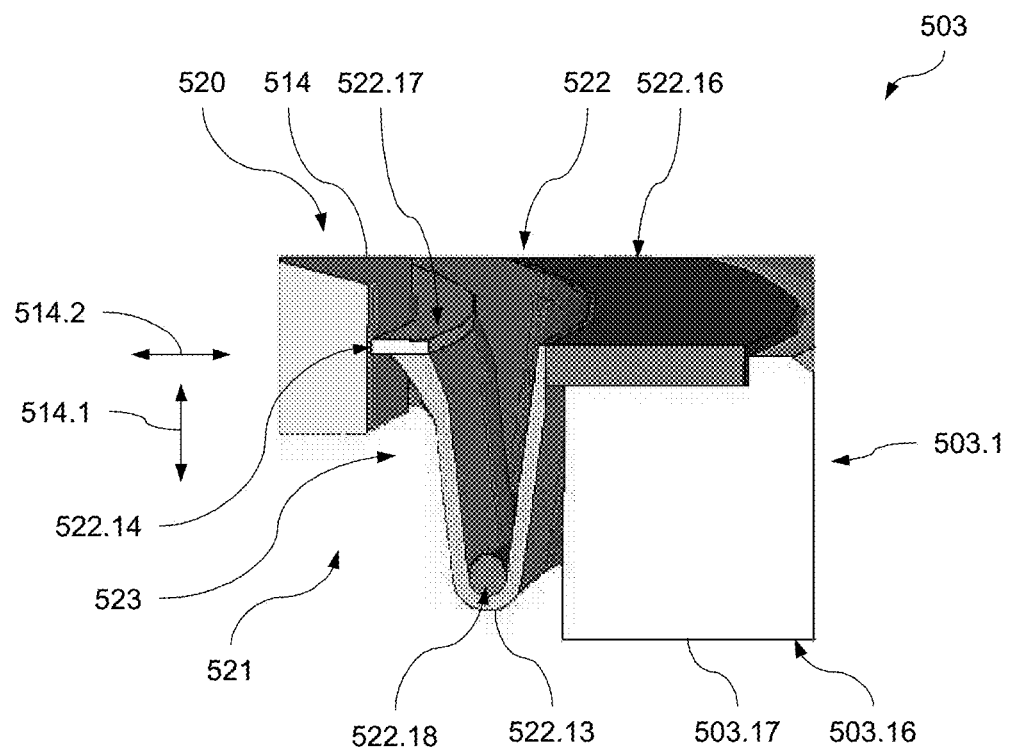
FIG. 9 is a schematic partial representation of an embodiment of an optical element unit according to the disclosure.

FIG. 9 shows a schematic partial representation of the last optical element module 503.16 holding the last optical element 514 of the optical element group 10 of FIG. 1. The last optical element 514 is held by a ring shaped last optical element holder 503.17 of the last optical element module 503.16. The last optical element 514 as a first component is connected to the associated last optical element holder 503.17 as a second component by a suitable connector mechanism, e.g. three connectors (not shown).

Apart from the locations where the connectors contact the last optical element 514, a circumferential sealing gap 523 is formed between the last optical element 514 and the last optical element holder 503.17.

At a first end of the sealing gap 523, a first space 520 is formed at the inner part of the housing 503.1 adjacent to the last optical element 514. At a second end of the sealing gap 523, a second space 521 is formed outside the housing 503.1 adjacent to the last optical element 514.

A sealing device 522 is provided to prevent fluid exchange between the first space 520 and the second space 521 via the sealing gap 523 while, at the same time substantially preventing the introduction of forces in the axial direction 514.1 and the radial direction 514.2 of the last optical element 514 via the sealing device 522.

To this end, the sealing device 522 includes an undulated elastic ring shaped thin polymeric membrane element 522.13 of substantially V-shaped cross-section. Here again, the membrane element 522.13 is coupled at its inner circumference to a metallic inner ring 522.17 of the sealing device 522. This inner ring 522.17, in turn, is adhesively coupled to the last optical element 514 via a ring of conventional sealing glue 522.14, e.g. a soft elastic sealing compound on polyurethane (PUR) basis with filler material. The sealing glue ring 522.14 extends at the outer circumference of the last optical element 514 and forms a fluid tight connection between inner ring 522.17 and the last optical element 514. At its outer circumference, the membrane element 522.13 is coupled to the last optical element holder 503.17 via a contact ring 522.16 of any suitable material. At the connection locations between the membrane element 522.13 and the inner ring 522.17 and the contact ring 522.16, a fluid tight connection is realized in any suitable known manner, respectively, e.g. adhesively, in a positive or a frictional connection or combinations thereof. To provide geometric stability to the membrane element 522.13, a thin elastic stabilization ring 522.18 is inserted into and suitably connected to the bottom section of the membrane element 522.13.

The low thickness and the undulated design of the membrane element 522.13 provides for a good deformation decoupling between the last optical element 514 and the last optical element holder 503.17 in the axial direction 514.1 and in the radial direction 514.1 as well. Again, thickness and cross-section of the membrane element 522.13 are selected as a function of the intended field of use of the optical element 514 and its maximum admissible deformations during this intended use.

It will be further appreciated that any suitable polymeric material may be used for the membrane element 522.13. Such materials may be natural or synthetic rubber (e.g. known as NR, ISOPRENE, IR), Polychloropene (e.g. known as NEOPRENE, CR), Nitrile and Hydrogenated Nitrile (e.g. known as NBR, HNBR BUNA N), Ethylene Propylene (e.g. known as NORDEL, EPM, EPDM), Fluor elastomerics (e.g. known as VITON, FKM), Perfluor elastomerics (e.g. known as KALREZ, FFKM, CHEMRAZ).

It will be further appreciated that the methods of sealing a first space of an optical element unit versus a second space of the optical element unit according to the disclosure as they have been described above in the context of FIGS. 1 to 4 may be executed with this optical element unit 503 as well. Thus, in this context, it is here only referred to the above explanations.

In the following, an embodiment of an optical element unit 603 according to the disclosure will be described with reference to FIGS. 10 to 13. The optical element unit 603 is largely identical with the optical element unit 203 of FIG. 6. The main difference lies within the design of the sealing device 622 that replaces the sealing device 222 of FIG. 6.

Figure 10:
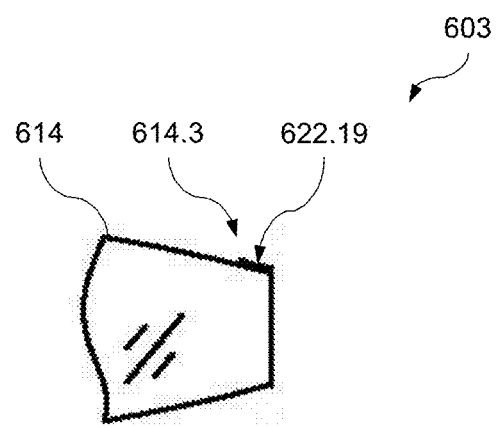
FIG. 10 is a schematic partial representation of an embodiment of an optical element unit according to the disclosure.
Figure 11:
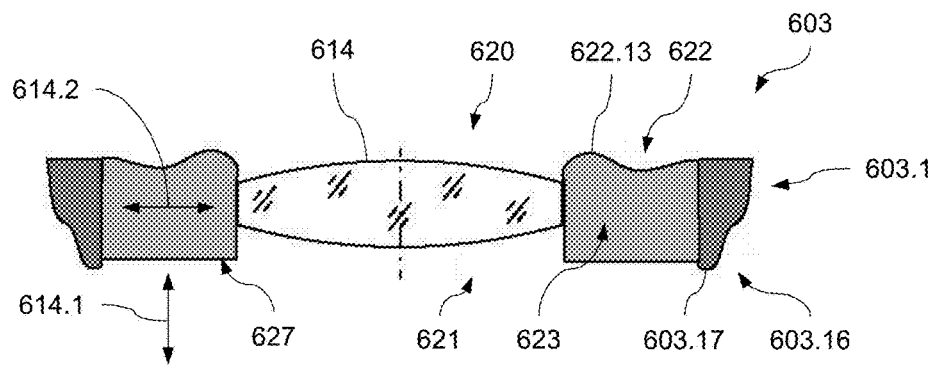
FIG. 11 is a schematic partial representation of an embodiment of an optical element unit according to the disclosure.
Figure 12:
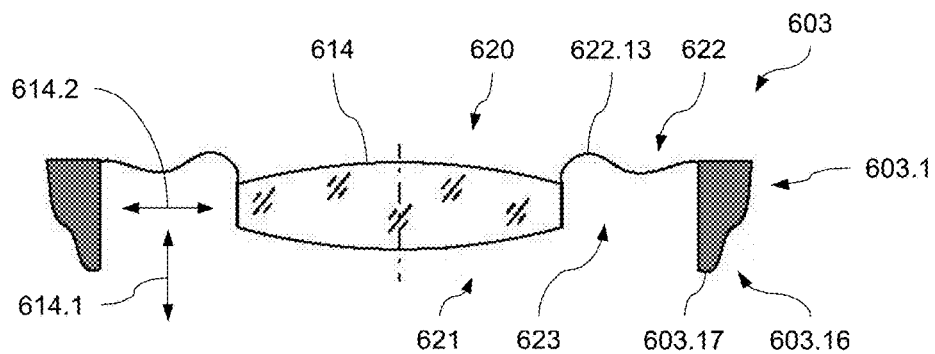
FIG. 12 is a schematic partial representation of an embodiment of an optical element unit according to the disclosure.
Figure 13:
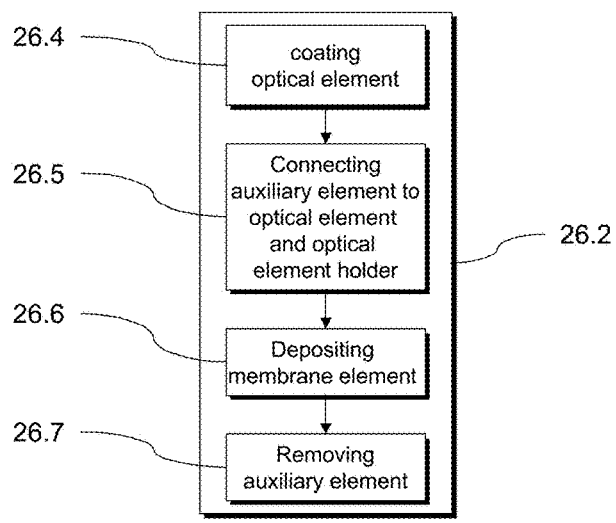
FIG. 13 is a block diagram of a detail of the block diagram of FIG. 4.

FIGS. 10 to 12 show schematic partial representations of components of the last optical element module 603.16 holding the last optical element 614 of the optical element group 10 of FIG. 1. The components are shown at different states during the step 26.2 of the second step 26 of FIG. 4 that is illustrated in further detail in FIG. 13.

The last optical element 614 is held by a ring shaped last optical element holder 603.17 of the last optical element module 603.16. The last optical element 614 as a first component is connected to the associated last optical element holder 603.17 as a second component by a suitable connector mechanism, e.g. three connectors (not shown).

Apart from the locations where the connectors contact the last optical element 614, a circumferential sealing gap 623 is formed between the last optical element 614 and the last optical element holder 603.17.

At a first end of the sealing gap 623, a first space 620 is formed at the inner part of the housing 603.1 adjacent to the last optical element 614. At a second end of the sealing gap 623, a second space 621 is formed outside the housing 603.1 adjacent to the last optical element 614.

A sealing device 622 is provided to prevent fluid exchange between the first space 620 and the second space 621 via the sealing gap 623 while, at the same time substantially preventing the introduction of forces in the axial direction 614.1 and the radial direction 614.2 of the last optical element 614 via the sealing device 622.

To this end, in a step 26.4 a ring shaped layer of an electrically conductive coating 622.19 (see FIG. 10) is deposited onto the optical element 614 in an optically unused peripheral area 614.3. The coating 622.19 is applied by a suitable technique, such as sputtering, vapor deposition or the like, that provides a tight connection between the coating 622.19 and the optical element 614.

In a step 26.5 a ring shaped electrically conductive auxiliary body 627 is connected in an electrically conductive manner to the coating 622.19 and an electrically conductive part of the optical element holder 603.17. In case the optical element holder 603.17 is not electrically conductive in itself, an electrically conductive coating may have been applied to it in a manner similar to the conductive coating 622.19 of the optical element 614. The auxiliary body 627 is shaped and arranged such that a substantially gapless connection is formed with the coating 622.19 and the optical element holder 603.17 over the entire circumference.

In a step 26.6 a metal or metal alloy is galvanically deposited on the coating 622.19, the auxiliary body 627 and the optical element holder 603.17 to form a very thin metallic membrane element 622.13 forming the sealing device 622 connected to the coating 622.19, i.e. the optical element 614, and the optical element holder 603.17 in a fluid tight manner.

In a step 26.7 the auxiliary body 627 is removed, e.g. dissolved, to provide the configuration shown in FIG. 12. It will be appreciated that the undulated elastic ring shaped thin membrane element 622.13 may be given any suitable cross-section via a corresponding geometry of the auxiliary body 627.

The low thickness and the undulated design of the membrane element 622.13 provides for a good deformation decoupling between the last optical element 614 and the last optical element holder 603.17 in the axial direction 614.1 and in the radial direction 614.1 as well. Again, thickness and cross-section of the membrane element 622.13 are selected as a function of the intended field of use of the optical element 614 and its maximum admissible deformations during this intended use.

Finally, it will be appreciated that any suitable metal that may be galvanically or otherwise deposited to form a suitably coherent membrane may be used for the membrane element 622.13. Preferably, the coefficient of thermal expansion of the membrane element 622.13 is adapted in a known manner to the coefficient of thermal expansion of the optical element 614 in order to avoid the introduction of thermally induced forces into the optical element 614. Where quartz ($SiO_2$) lenses are used, Invar may be selected as the metal, while brass alloys may be used in combination with calcium fluoride ($CaF_2$) lenses.

It will be further appreciated that the methods of sealing a first space of an optical element unit versus a second space of the optical element unit according to the disclosure as they have been described above in the context of FIGS. 1 to 4 may be executed with this optical element unit 603 as well. Thus, in this context, it is here only referred to the above explanations.

In the foregoing, the disclosure has been described only in the context of applications where at least one sealing gap is formed between the optically active part, e.g. the transmissive part, of the last optical element and a housing. However, it will be appreciated that the sealing gap may also be formed between an optically inactive part of the optical element, e.g. a non-transmissive element connected to the transmissive part of the last optical element in a fluid tight manner and held together as the last optical element, and a housing element. Such an optically inactive element may, for example, be a ring shaped element having substantially the same coefficient of thermal expansion.

Furthermore, it will be appreciated that the disclosure may be used in the context of any rotationally symmetric or non-rotationally symmetric shape of the optical element. Thus, for example, the optical element may have an at least partly arbitrarily curved and/or an at least partly polygonal shape in its plane of main extension.

In the foregoing, the disclosure has been described only for last optical elements where the sealing of the sealing gap to the optical element holder is provided against an exterior atmosphere of the optical element unit. However, it will be appreciated that the disclosure may also be used in the context of first optical elements located at an entry end of an optical system held within a corresponding housing. It will also be appreciated that the housing mentioned above does not necessarily have to be spatially separated from another housing. Finally, it will be appreciated that these solutions may also be applied to configurations where different compartments within the optical element unit have to be sealed with respect to each other.

Finally, in the foregoing, the disclosure has been described only in the context of microlithography applications. However, it will be appreciated that the disclosure may be used in the context of any other imaging process using immersion techniques or not.

What is claimed is:

1. An optical element unit, comprising:
   a first part;
   a second part; and
   a viscous fluid,
   wherein:
   the first part is adjacent to the second part so that a slot is between the first part and the second part;
   a first space is at a first side of the slot;
   a second space is at a second side of the slot;
   the slot is between a recessed section defining a recess and a protrusion extending into the recess;
   the slot defines a passageway between the first space and the second space;
   the viscous fluid at least partially obstructs the passageway;
   the passageway is at least partially defined by a first slot and a second slot sequentially arranged on a way from the first space to the second space;
   each of the first and second slots is between a recessed section defining a recess and a protrusion extending into the recess; and
   each recess are at least partially filled with the viscous fluid; and
   each protrusion extends into the viscous fluid to define an obstruction.

2. The optical element unit of claim 1, wherein the first part comprises an optical element, and the second part comprises an element of a support structure supporting the optical element.

3. The optical element unit of claim 1, further comprising a first optical element and a second optical element, wherein the first part is an element of a support structure supporting the first optical element, and the second part is an element of a support structure supporting the second optical element.

4. The optical element unit of claim 1, wherein the viscous fluid substantially prevents fluid exchange between the first space and the second space via the passageway.

5. The optical element unit of claim 1, wherein:
   the first part is selected from the group consisting of a first component and a first element mechanically connected to the first component; and
   the second part is selected from the group consisting of a second component and a second element mechanically connected to the second component.

6. The optical element unit of claim 5, wherein a position of the first element with respect to the first component is adjustable, and/or a position of the second element with respect to the second component is adjustable.

7. The optical element unit of claim 5, wherein:
   the obstruction is adapted to substantially prevent, in a first direction and/or a second direction running transverse to the first direction, the introduction of forces of an inadmissible force level into the first component via the obstruction;
   the inadmissible force level is a function of an intended field of use of the first component;
   the field of use defines a maximum admissible deformation of the first component; and
   the inadmissible force level is a function of the maximum admissible deformation.

8. The optical element unit of claim 1, wherein the protrusion is on the first part or the second part, the recessed section is formed on the other one of the first part and the second part.

9. The optical element unit of claim 1, wherein at least one slot selected from the group consisting of the first slot and the second slot is narrow in a direction running transverse to the passageway defined by the at least one slot.

10. The optical element unit of claim 9, wherein:
    the at least one slot has a dimension in the direction; and
    the dimension is configured so that, due to capillary effects, substantially no fluid leaks from the slot upon a pressure difference between the first space and the second space.

11. The optical element unit of claim 9, wherein the at least one slot has a dimension of less than 200 µm in the direction.

12. The optical element unit of claim 9, wherein the at least one slot has a dimension in the direction, and the dimension increases toward an end section of the at least one slot.

13. The optical element unit of claim 1, further comprising a fluid buffer connected to the passageway so that the fluid the obstruction of the passageway.

14. The optical element unit of claim 1, wherein the viscous fluid has a viscosity that is adjustable via an external field.

15. The optical element unit of claim 14, wherein the external field comprises at least one field selected from the group consisting of a magnetic field, an electric field, a thermal field and a gravitational field.

16. The optical element unit of claim 14, further comprising a device configured to provide the external field in a region of the obstruction.

17. The optical element unit of claim 1, further comprising an exhaust device comprising an inlet spatially associated to the obstruction, wherein the exhaust device is configured to draw off via the inlet gaseous substances emitted by the viscous fluid.

18. An apparatus, comprising:
an optical element unit according to claim 1,
wherein the apparatus is an optical exposure apparatus configured to transfer an image of a pattern on a mask onto a substrate along a light path, and the optical element unit is in the light path between the mask location and the substrate.

19. A method, comprising:
providing an optical element unit comprising a first part and a second part, the first part being located adjacent to the second part to define a slot between the first part and the second part, the first space being at a first side of the slot, and the second space being at a second side of the slot, the slot being between a recessed section defining a recess and a protrusion extending into the recess to define a passageway between the first space and the second space; and
using a viscous fluid to provide an obstruction of at least a part of the passageway,
wherein:
the passageway is at least partially defined by a first slot and a second slot sequentially arranged on a way from the first space to the second space;
each of the first and second slots is between a recessed section defining a recess and a protrusion extending into the recess;
each recess is at least partially filled with the viscous fluid; and
each protrusion extends into the viscous fluid to define the obstruction.

20. The method of claim 19, wherein:
the first part is a first element mechanically connected to a first component;
the second part is a second element mechanically connected to the second component; and
a position of the first element with respect to the first component is adjusted, and/or a position of the second element with respect to the second component is adjusted.

21. The method of claim 19, wherein:
the slot has a dimension in a direction running transverse to the passageway; and
the dimension is configured so that, due to capillary effects, substantially no fluid leaks from the slot upon a pressure difference between the first space and the second space.

22. The method of claim 19, further comprising a fluid buffer connected to the passageway to provide the fluid to the passageway to maintain the obstruction of the passageway.

23. The method of claim 19, further comprising using an external field in a region of the obstruction to adjust a viscosity of the viscous fluid.

24. The method of claim 19, further comprising drawing off gaseous substances emitted by the fluid in the region of the obstruction.

25. The method of claim 19, further comprising using the optical element unit to transfer an image of a pattern on a mask onto a substrate.

26. An optical element unit, comprising:
a first part;
a second part; and
a viscous fluid,
wherein:
the first part is adjacent to the second part so that a slot is between the first part and the second part;
a first space is at a first side of the slot;
a second space is at a second side of the slot;
the slot is between a recessed section defining a recess and a protrusion extending into the recess;
the slot defines a passageway between the first space and the second space; and
the viscous fluid at least partially obstructs the passageway;
the slot is narrow in a direction running transverse to the passageway defined by the slot;
the slot has a dimension in the direction; and
the dimension is configured so that, due to capillary effects, substantially no fluid leaks from the slot upon a pressure difference between the first space and the second space.

27. The optical element unit of claim 26, wherein the slot has a dimension of less than 200 µm in the direction.

28. The optical element unit of claim 26, wherein the slot has a dimension in the direction, and the dimension increases toward an end section of the slot.

29. A method, comprising:
providing an optical element unit comprising a first part and a second part, the first part being located adjacent to the second part to define a slot between the first part and the second part, the first space being at a first side of the slot, and the second space being at a second side of the slot, the slot being between a recessed section defining a recess and a protrusion extending into the recess to define a passageway between the first space and the second space; and
using a viscous fluid to provide an obstruction of at least a part of the passageway,
wherein:
the slot has a dimension in a direction running transverse to the passageway; and
the dimension is configured so that, due to capillary effects, substantially no fluid leaks from the slot upon a pressure difference between the first space and the second space.

* * * * *

UNITED STATES PATENT AND TRADEMARK OFFICE
CERTIFICATE OF CORRECTION

PATENT NO. : 10,203,607 B2
APPLICATION NO. : 14/560756
DATED : February 12, 2019
INVENTOR(S) : Tilman Schwertner et al.

It is certified that error appears in the above-identified patent and that said Letters Patent is hereby corrected as shown below:

In the Specification

Column 12, Line 18: Delete "magneto-rhelogical" and insert -- magneto-rheological --, therefor.

Column 12, Line 30: Delete "magneto-rhelogical" and insert -- magneto-rheological --, therefor.

Column 12, Line 31: Delete "magneto-rhelogical" and insert -- magneto-rheological --, therefor.

Column 12, Line 54: Delete "magneto-rhelogical" and insert -- magneto-rheological --, therefor.

Column 12, Line 61: Delete "of" and insert -- off --, therefor.

Column 14, Line 49: Delete "compund" and insert -- compound --, therefor.

Column 15, Line 14: Delete "microlithograpy" and insert -- microlithography --, therefor.

Column 15, Line 14: Delete "desird" and insert -- desired --, therefor.

Column 15, Line 27: Delete "microlithograpy" and insert -- microlithography --, therefor.

Column 16, Line 62: Delete "Polychloropene" and insert -- Polychloroprene --, therefor.

Column 18, Line 23: After "lenses" insert -- . --.

Column 18, Line 33: Delete "Polychloropene" and insert -- Polychloroprene --, therefor.

Column 19, Line 45: Delete "Polychloropene" and insert -- Polychloroprene --, therefor.

Signed and Sealed this
Second Day of July, 2019

Andrei Iancu
*Director of the United States Patent and Trademark Office*

CERTIFICATE OF CORRECTION (continued)
U.S. Pat. No. 10,203,607 B2

In the Claims

Column 23, Lines 2-3 (Claim 13): Delete "so that the fluid" and insert -- to maintain --.